United States Patent [19]

Ito

[11] Patent Number: 4,629,595
[45] Date of Patent: Dec. 16, 1986

[54] METHOD OF MAKING A PLASTIC CASING WITH A CONDUCTIVE FILM

[75] Inventor: Tosikazu Ito, Nagoya, Japan

[73] Assignee: Tokai Kogyo Kabushiki Kaisha, Obu, Japan

[21] Appl. No.: 706,551

[22] Filed: Feb. 28, 1985

[30] Foreign Application Priority Data

Mar. 12, 1984 [JP] Japan ................................ 59-45876

[51] Int. Cl.⁴ .............................................. B29D 9/00
[52] U.S. Cl. .................................. 264/104; 264/105; 428/547; 428/408
[58] Field of Search ............................... 264/104, 105

[56] References Cited

U.S. PATENT DOCUMENTS

| | | | |
|---|---|---|---|
| 3,846,223 | 11/1974 | Lederman et al. | 264/105 |
| 4,081,578 | 3/1978 | van Essen et al. | 264/255 |
| 4,442,055 | 4/1984 | Oelsch et al. | 264/104 |

FOREIGN PATENT DOCUMENTS

| | | | |
|---|---|---|---|
| 2535180 | 2/1976 | Fed. Rep. of Germany | 264/105 |
| 48-25061 | 7/1973 | Japan | 264/105 |
| 59-138414 | 8/1984 | Japan | 264/104 |

Primary Examiner—James Derrington
Attorney, Agent, or Firm—Erwin S. Teltscher

[57] ABSTRACT

Disclosed herein is a method of making a plastic casing with a conductive film which is effective to screen electromagnetic waves and prevent electrification. The method comprises the steps of removably coating a conductive material containing coarse conductive powder onto a mold surface of a mold set for forming a plastic casing, drying the coated conductive material to form a solidified film, injecting a fluidized thermoplastic material under high pressure into the mold set, and compressing the solidified film by the high temperature and high pressure of the thermoplastic material, thereby anchoring the solidified film to the contact surface of the molded casing opposite to the solidified film. The conductive film of the plastic casing thus made has a highly aggregate layer in which the particles of conductive powder are densely collected into point-to-point and/or surface-to-surface contact so that the contacting area of the particles is vastly increased.

11 Claims, 6 Drawing Figures

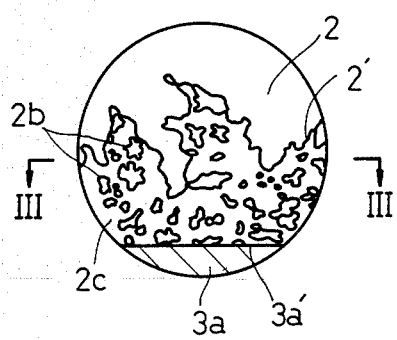
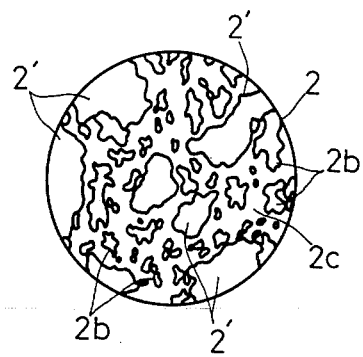
FIG.2  FIG.3
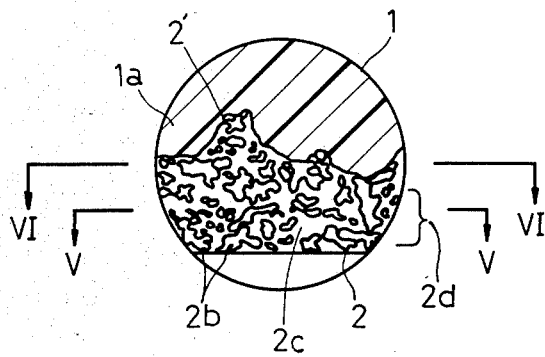
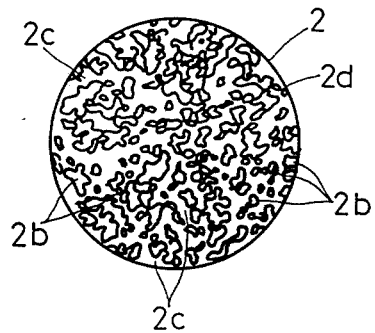
FIG.4  FIG.5
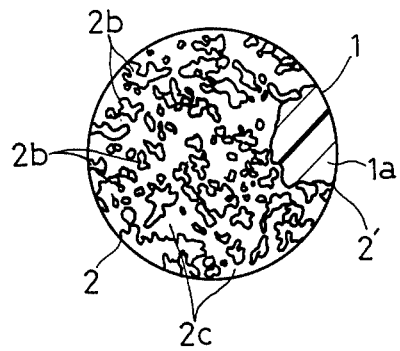
FIG.6

METHOD OF MAKING A PLASTIC CASING WITH A CONDUCTIVE FILM

BACKGROUND OF THE INVENTION

1. Field of the Invention

The present invention relates to a plastic casing with a conductive film for housing electronic instruments and to a method of making same, and is more specifically concerned with a method of making a plastic casing having the function of screening electromagnetic waves and preventing electrification.

2. Description of the Prior Art

In general, plastic casings for housing electrical instruments are imparted conductivity to screen electromagnetic waves and to prevent electrification. Such conductivity has been created mainly by coating surfaces of the casing with a conductive coating film. Such a process of coating a conductive material has been widely employed, as it is advantageous in the viewpoint of equipment costs, manpower, etc. Such a process, however, has difficulties in that it requires treatments for the solvent contained in the coating material which may cause breakage or discoloration of the final coating film, and an additional coating to ensure adhesion and prevent removal of the coating film. Further, most of coarse conductive powders contained in the coating material are contacted point-to-point or through a binder, thereby reducing conductivity and the effect of screening electromagnetic waves.

SUMMARY OF THE INVENTION

It is an object of the present invention to provide a method of making a plastic casing coated with a film which has a good conductivity and which is highly effective to screen electromagnetic waves.

It is another object of the present invention to provide a method of making a plastic casing in which the coating film is firmly anchored to the surface of the casing, thereby increasing the durability of the casing.

It is still another object of the present invention to provide a method of making a plastic casing with a conductive film in which the solvent contained in the film is volatilized so as to prevent any possible defects in quality which might be caused by the contained solvent.

It is a further object of the present invention to provide a method of making a plastic casing which has a coating film whose surface is fine and has esthetic effects.

According to the invention, there is provided a method of making a plastic casing comprising the steps of removably coating a conductive material containing a coarse conductive powder and a binder onto a mold surface of a mold set to form a plastic casing; drying the coated conductive material to form a solidified film having a rugged surface; injecting a fluidized thermoplastic material under pressure into the mold set; and compressing the solidified film by the high temperature and high pressure of the thermoplastic material, thereby severing the binder under pressure, bringing and densely collecting the particles of the coarse powder into point-to-point and/or surface-to-surface contact, and anchoring the solidifed film to the contact surface of the molded casing opposite to the solidified film. The conductive film of the plastic casing thus made has a highly aggregate layer in which the particles of conductive powder are densely collected into point-to-point and/or surface-to-surface so that the contacting area of the particles is vastly increased.

BRIEF DESCRIPTION OF THE DRAWINGS

FIG. 2 is an enlarged view of the portion encircled in FIG. 1, step C;

FIG. 3 is a sectional view taken along the line III—III of FIG. 2;

FIG. 4 is a fragmentary sectional view, on an enlarged scale, of a portion of the casing with a conductive film made according to the present invention;

FIG. 5 is a sectional view taken along the line V—V of FIG. 4; and

FIG. 6 is a sectional view taken along the line VI—VI of FIG. 4.

DETAILED DESCRIPTION OF A PREFERRED EMBODIMENT

Figure 1:
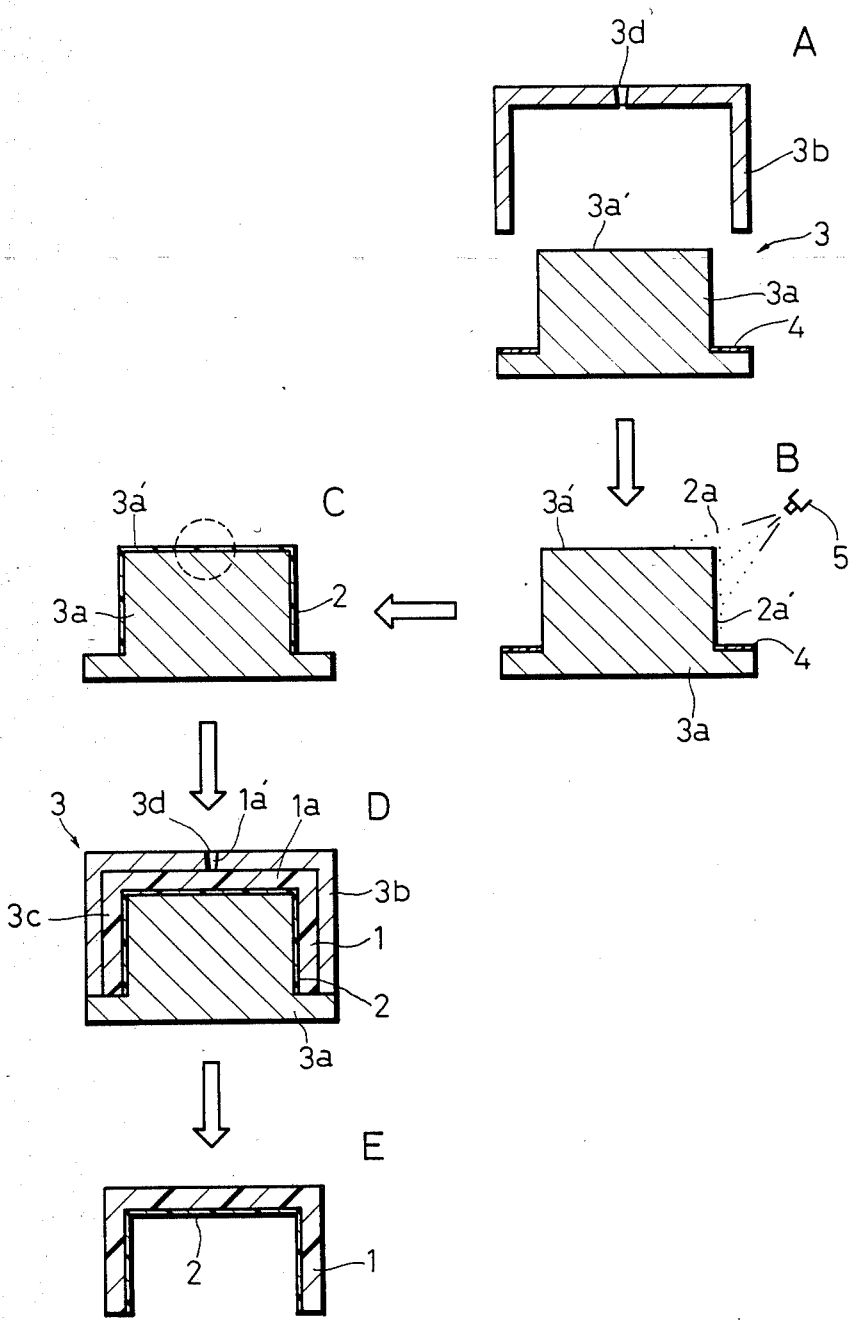
FIG. 1 is a diagrammatical representation illustrating certain desirable sequences of steps which may be employed in the method of the present invention.

Referring now to the drawings and in particular to FIG. 1, there is shown a plastic casing 1 which is the subject of the present invention. Briefly stated and without at this point elaborating upon the method whereby the plastic casing 1 is made, the plastic casing 1 finally produced has a conductive film 2 coated on its surface which is effective to screen electromagnetic waves and prevent electrification. The film 2 is anchored to the surface of the casing 1 by use of a mold set 3 which is composed of a movable mold half 3a and a fixed mold half 3b. The method of making the plastic casing 1 is seen to consist of precoating step A, coating step B, hot drying step C, molding step D and releasing step E.

As generally seen from FIG. 1, in the precoating step A, a masking material 4 is deposited on the essential portion of o the mold surface 3a' of the movable mold half 3a. Subsequently in the coating step B, a thermoplastic and conductive coating material 2a is removably coated on the mold surface 3a' as by a spray gun 5 to form a film having average 100 micron thickness. In a preferred embodiment, the conductive coating material 2a is a composite material which contains, as coarse conductive powder 2b, 80 parts by weight of coarse powder of copper having average 30 micron particle diameter; as binder 2c, 20 parts by weight of acrylic resin; and, as solvent, 50 parts by weight of ethyl acetate. As best shown in FIGS. 2 and 3, in the hot D drying step C, the solvent contained in the coated film 2a' is volatilized by hot blast of about 60° C. to form a solidified film 2 with a rugged surface 2' ascribable to the interior coarse powder 2b. At this time, the interior coarse powder 2b is scattered uniformly in the film 2. In the molding step D, the movable mold half 3a and the fixed mold half 3b are closed (under mold clamping force of 150 tons) by moving the movable mold half 3b toward the fixed mold half 3a. Then, a fluidized thermoplastic material for forming a casing, for example, an acrylonitrile-butadiene-styrene (ABS) resin 1a' (such as one sold under the tradename "Cevian-V" and manufactured by Daicel Chemical Industries, Ltd.) is injected into the cavity 3c of the mold set 3 through a sprue hole 3d to thereby mold a casing 1. Thereafter, a further high pressure of about 25 tons is applied to the injected material 1a by a hydraulic system (not shown) to increase the internal pressure. The coating film 2 is then plasticized and compressed by the heat and pressure of the material 1a into 40–80% by thickness of the film 2 (i.e. average 60 microns in this embodiment). As this occurs, the binder 2c is severed under pressure, and the particles of the conductive powder 2b are collected while contacting point-to-point and/or surface-to-surface, thereby forming a highly aggregate layer 2d of the conductive coarse powder 2b where the contacting area of the particles is vastly increased without the intervening binder 2c. Thus, the coating film 2 is anchored to and rearranged in the surface of the molded casing 1. Specifically, the material 1a is anchored to the rugged surface 2' of the film 2 and at the same time, the material 1a is fused with the binder 2c at their contacting surfaces. In the releasing step E, the mold set 3 is opened to remove the casing 1 with the film 2, that is the final plastic casing 1 with a conductive film.

In this embodiment, the coating film 2 is anchored to the interior surface of the casing 1. However, it is not limited to this form. Further, the thickness of the coating film 2 may be determined as desired.

According to the present invention, the casing 1 is very effective to prevent electrification and screen electromagnetic waves since, as may be seen from FIGS. 4 and 5, the conductive film 2 has a highly aggregate layer 2d of the coarse conductive powder 2b where the contacting area of the particles is vastly increased without the intervening binder 2c. The benefit of the invention has been demonstrated by comparative tests on different plates of bulk resistance and screening capability in magnetic field. In the tests, two types of plates (150×150×3 mm) were used: a plate cut out from the casing 1 of the invention and an ABS resin plate coated with the same conductive film as used in the foregoing embodiment and having average 100 micron thickness. The following Tables 1 and 2 show the results of comparative tests.

TABLE 1

| Plate Type | Bulk Resistance (Ω-cm) |
| --- | --- |
| Comparative Plate | $1.1 \times 10^{-4}$ |
| Present Invention | $0.3 \times 10^{-4}$ |

TABLE 2

| | Screening Capability in Magnetic Field (dB) according to Frequency (MHz) | | | | | | | | | | |
| --- | --- | --- | --- | --- | --- | --- | --- | --- | --- | --- | --- |
| | 50 | 100 | 200 | 300 | 400 | 500 | 600 | 700 | 800 | 900 | 1000 |
| Comparative Plate | 20 | 25 | 31 | 33 | 33 | 35 | 35 | 41 | 41 | 33 | 32 |
| Present Invention | 39 | 46 | 41 | 49 | 40 | 49 | 42 | 53 | 54 | 50 | 50 |

As is apparent from Tables 1 and 2, the casing 1 of the invention has good conductivity and high screening capability.

From the foregoing description, it can be appreciated that the coating film 2 may be firmly anchored to the surface of the casing 1, since the coating film 2 is plasticized by the heat of the material 1a under the molding pressure and rearranged in the surface of the casing 1. Also, it can be appreciated that the treatment for solvent as is required in the prior art can be eliminated and the quality of the products can be improved, since, according to the present method, the solvent contained in the coating film 2 is volatilized in the hot drying step C. Further, the surface of the coating film 2 is smooth and fine and has esthetic effects, since the coating film 2 anchored to the surface of the casing 1 has an exterior surface equivalent to the molding surface 3a'. Finally, the process of the present invention advantageously offers the possibility of retouching the coating film 2 in the steps B, C, etc.

While the invention has been described with reference to a preferred embodiment thereof, it is to be understood that modifications or variations may be easily made without departing from the scope of this invention which is defined by the appended claims.

What is claimed is:

1. A method of making a plastic casing with a conductive film in a mold set having a movable mold half and a fixed mold half, each defining a respective mold surface, wherein when the movable mold half and the fixed mold half are closed, a cavity for forming a plastic casing is defined between the mold halves, comprisig the steps of:
    (a) coating removably at least one of the mold surfaces facing the cavity with a conductive coating material containing a coarse conductive powder and a thermoplastic resin binder dissolved in a solvent;
    (b) drying the coated conductive material with heat to form a solidified film having a rugged surface;
    (c) closing the movable mold half and the fixed mold half;
    (d) injecting a fluidized thermoplastic material under pressure into the cavity between the mold halves to form a casing in contact with said conductive coating;
    (e) applying additional pressure to the injected thermoplastic material to plasticize and compress the solidified film of conductive material due to the pressure and heat of the injected thermoplastic material, said additional pressure and said heat being sufficient to sever the binder which thereby causes the particles of coarse conductive powder to be densely collected into point-to-point and/or surface-to-surface contact and to anchor the solidified film to the surface of the thus molded casing;
    (f) releasing the movable mold half from the fixed mold half and
    (g) removing the plastic casing with the conductive film from the mold set.

2. The method as defined in claim 1 wherein said conductive coating material is applied to the mold surface of the movable mold half.

3. The method as defined in claim 1 wherein said coarse conductive powder is of nickel, copper or carbon black.

4. The method as defined in in claim 1 wherein said thermoplastic resin is acrylic resin.

5. The method as defined in claim 1 wherein said solvent comprises ethyl acetate.

6. The method as defined in claim 1 wherein said conductive coating material contains 80 parts by weight of coarse powder of copper having average 30 micron particle diameter, 20 parts by weight of acrylic resin and 50 parts by weight of ethyl acetate.

7. The method as defined in claim 1 wherein the thickness of said conductive coating material coated on said mold surface is 100 microns.

8. The method as defined in claim 1 wherein said thermoplastic material for molding a casing comprises an acrylonitrile-butadiene-styrene resin.

9. The method defined in claim 1 wherein the coated conductive material is dried by a hot air blast of about 60° C. to form a solidified film having a rugged surface.

10. The method defined in claim 1 wherein additional pressure is applied to the injected material, sufficient to plasticize and compress the conductive coating material by 40% to 80% in thickness relative to the initial solidified film of conductive material.

11. The method defined in claim 1 wherein the additional pressure applied to the injective material is about 25 tons.

* * * * *